United States Patent
Kau et al.

(10) Patent No.: US 8,385,100 B2
(45) Date of Patent: Feb. 26, 2013

(54) ENERGY-EFFICIENT SET WRITE OF PHASE CHANGE MEMORY WITH SWITCH

(75) Inventors: Derchang Kau, Cupertino, CA (US); Johannes Kalb, San Jose, CA (US); Elijah Karpov, Santa Clara, CA (US); Gianpaolo Spadini, Campbell, CA (US)

(73) Assignee: Intel Corporation, Santa Clara, CA (US)

( * ) Notice: Subject to any disclaimer, the term of this patent is extended or adjusted under 35 U.S.C. 154(b) by 90 days.

(21) Appl. No.: 12/653,092

(22) Filed: Dec. 8, 2009

(65) Prior Publication Data

US 2011/0134685 A1 Jun. 9, 2011

(51) Int. Cl.
*G11C 11/00* (2006.01)
(52) U.S. Cl. ...................................... 365/148
(58) Field of Classification Search .................... 365/148
See application file for complete search history.

(56) References Cited

U.S. PATENT DOCUMENTS

| | | | |
|---|---|---|---|
| 7,135,696 B2 | 11/2006 | Karpov et al. | |
| 7,359,231 B2 * | 4/2008 | Venkataraman et al. | 365/148 |
| 2006/0073652 A1 | 4/2006 | Pellizzer et al. | |
| 2006/0227592 A1 | 10/2006 | Parkinson et al. | |
| 2007/0041245 A1 | 2/2007 | Ahn | |
| 2008/0310211 A1 | 12/2008 | Toda et al. | |
| 2009/0114898 A1 | 5/2009 | Ricker et al. | |
| 2010/0182827 A1 * | 7/2010 | Kostylev et al. | 365/163 |
| 2010/0214829 A1 | 8/2010 | Breitwisch et al. | |
| 2010/0232205 A1 * | 9/2010 | Parkinson | 365/148 |
| 2012/0140553 A1 | 6/2012 | Kalb et al. | |

FOREIGN PATENT DOCUMENTS

| | | |
|---|---|---|
| WO | 2011001594 | 6/2011 |
| WO | 2011071594 A3 | 8/2011 |

OTHER PUBLICATIONS

Ferdinando Bedeschi et al., A Bipolar-Selected Phase Change Memory Featuring Multi-Level Cell Storage, IEEE Journal of Solid-State Circuits, vol. 44, No. 1, Jan. 2009, pp. 217-227.*
International Search Report and Written Opinion received for PCT Patent Application NO. PCT/US2010/052833, mailed on Jul. 1, 2011, 9 pages.
International Preliminary Report and Written Opinion Received for PCT Patent Application No. PCT/US2010/052833, mailed on Jun. 21, 2012, 6 pages.

* cited by examiner

*Primary Examiner* — Hoai V Ho
*Assistant Examiner* — Pablo Huerta
(74) *Attorney, Agent, or Firm* — Cool Patent, P.C.; Kenneth J. Cool

(57) ABSTRACT

Embodiments of apparatus and methods for an energy efficient set write of phase change memory with switch are generally described herein. Other embodiments may be described and claimed.

17 Claims, 5 Drawing Sheets

ENERGY-EFFICIENT SET WRITE OF PHASE CHANGE MEMORY WITH SWITCH

BACKGROUND OF THE INVENTION

1. Field of the Invention

The present invention relates to a field of electronics including semiconductor devices, and more specifically to improving a write SET operation for a phase change memory with switch (PCMS).

2. Discussion of Related Art

Dynamic Random Access Memory (DRAM) and Static Random Access Memory (SRAM) technologies are widely used to store information in electronic systems. However, both DRAM and SRAM are volatile memories that lose stored information whenever electrical power is interrupted. To avoid loss of data and/or code, it is desirable to store certain information in non-volatile memory, especially for portable electronic systems such as mobile internet devices (MID)s or mobile stations.

Flash memory is a type of non-volatile memory. However, despite possessing high density, flash memory may not be scalable to very small dimensions since information is stored as charge in a floating gate. A reduction in the number of electrons per bit can ultimately degrade the reliability of stored information.

Phase-change memory with switch (PCMS) is a type of non-volatile memory that is scaleable to extremely small dimensions. A PCMS device may be configured to allow for bit selective erase since every memory cell may be addressed separately by selecting a combination of bit line and word line.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE PRESENT INVENTION

In the following detailed description, numerous specific details for an energy-efficient PCMS are set forth to provide a thorough understanding of the invention. However, it will be understood by those skilled in the art that the present invention may be practiced without these specific details. In other instances, well-known methods, procedures, components and circuits have not been described in detail so as not to obscure the present invention.

It would be an advance in the art to provide a way to decrease energy consumption for writing of a phase change memory (PCM) storage element. The PCM element may be configured as a combined device comprising a switch, such as an ovonic threshold switch (OTS), to form a PCMS device. A PCMS device may be RESET using only a fraction of the energy typically used to SET the PCMS device with a completely crystallized PCM storage element. The higher energy consumption is due to relatively longer times required to crystallize the entire PCM storage element as compared to the time necessary to RESET the PCM storage element.

It would be helpful to provide an apparatus and methods to provide a PCMS device that may be SET using only a fraction of the energy that would otherwise be necessary to SET the PCMS device. Use of an energy efficient memory device comprising PCMS and related methods would be helpful for use in electronic devices that use memory devices, particularly those electronic devices with a finite energy source such as battery operated stations including cell phones, mobile internet devices, netbooks, and other mobile devices.

One such method comprises writing (SET) a phase change memory with switch (PCMS) having an ovonic threshold switch (OTS) and a PCM storage element by using one or more low-energy SET pulses that do not crystallize a phase change material completely but create one or more crystalline filaments, conducting filaments, or partially crystallized regions in an otherwise amorphous volume. While this SET process may not necessarily reduce the resistance of the phase change material to levels observed in a conventional phase change memory (where no snap-back selector such as the OTS is present), it may reduce the threshold voltage of the phase change material sufficiently to enable a snap-back of the PCMS cell during a demarcation voltage read. Another method may comprise using a low-energy SET pulse to threshold an ovonic threshold switch (OTS) and write a phase change material in a PCM storage element of a phase change memory with switch (PCMS), wherein the PCM storage element comprises an amorphous volume after writing the phase change material, and using a demarcation voltage to read the PCMS.

Figure 1:
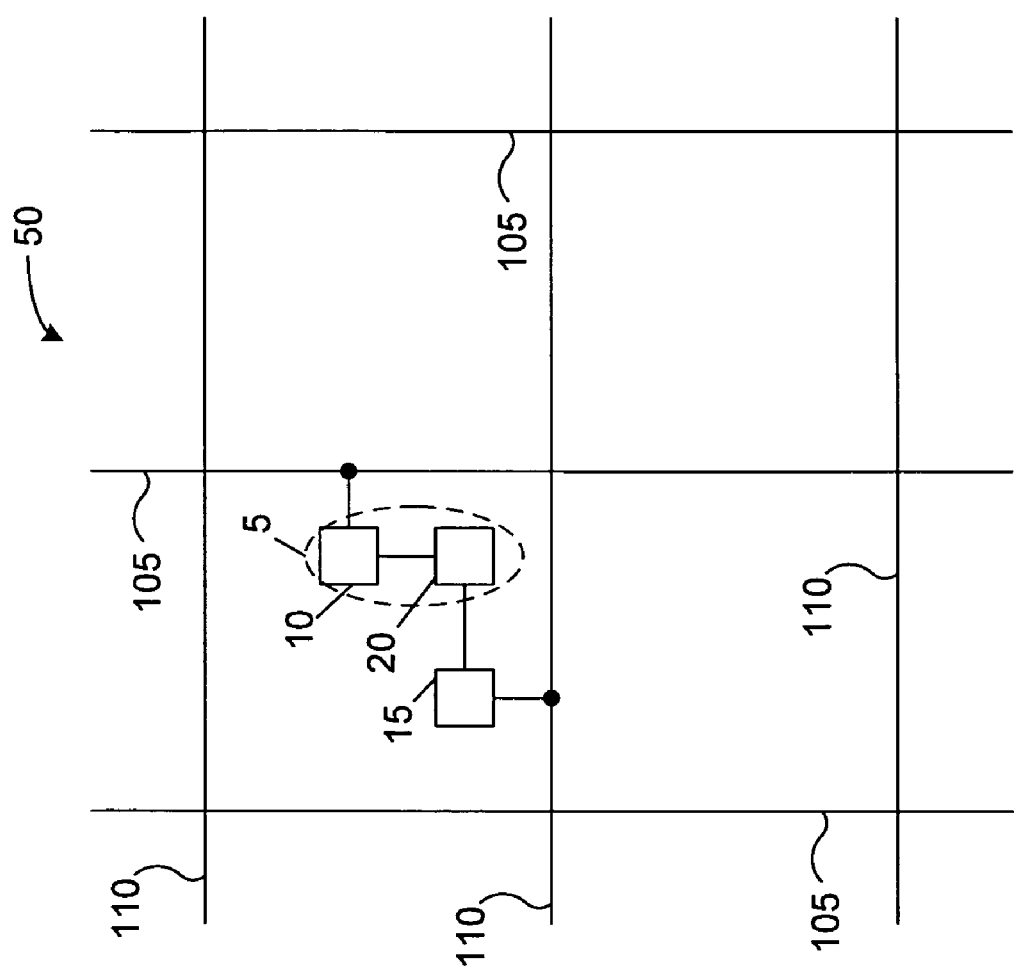
FIG. 1 shows an array of a phase change memory with switch (PCMS) organized into bit lines and word lines according to an embodiment of the present invention.

Now turning to the figures, FIG. 1 illustrates an array of a PCMS 50 organized into bit lines 105 and word lines 110 according to an embodiment of the present invention. As shown in an embodiment of the present invention in FIG. 1, the PCMS comprises a phase change memory (PCM) element 20, a heater element 15, and a snapback selector or access element 10. In an alternate embodiment, the PCMS does not include a heater element 15.

The PCM storage element 20 includes a phase change material. In an embodiment of the present invention, the phase change material may include two properties: (a) it can exist locally in an amorphous phase without crystallization for a prolonged period of time, such as for several years, at room temperature, and (b) the amorphous phase can crystallize rapidly if temperature is raised to about 100 to 350 degrees Centigrade (C).

In general, a crystallization time of the phase change material decreases with increasing temperature. For example, if an amorphous PCM storage element 20 is heated up to ~150 C, it will crystallize within a minute or so. If the amorphous PCM is heated quickly up to ~200 C, it will crystallize within a second. If the amorphous PCM is heated very quickly up to ~300 C, such as by a pulse, it will crystallize within a microsecond. Thus, the phase change material may remain stable locally in one of the two phases or in a combination of the two phases. For the phase change material, the crystalline phase is energetically more favorable (lower free energy) than the amorphous phase.

A large variety of phase change material types with widely differing properties may be selected for the PCM storage element 20. The phase change material may include a stoichiometric or a non-stoichiometric compound. The phase change material may include a eutectic or a peritectic material. The phase change material may include a single-phase or multiphase materials. The phase change material may be doped with various elements. In an embodiment of the present invention, the phase change material may have a binary composition, a ternary composition, or a quaternary composition. In another embodiment of the present invention, the phase change material may have a pseudo-binary composition.

The phase change material is called a chalcogenide alloy if it includes at least one element from Group VI A of the periodic table. Some phase change materials include elements from Group III A, Group V A, and Group VI A. Examples include GaSbTe and InSbTe. Other phase change materials include elements from Group IV A, Group V A, and Group VI A. Group III A of the periodic table includes elements such as gallium and indium. Group IV A of the periodic table includes elements such as silicon, germanium, and tin. Group V A of the periodic table includes elements such as phosphorus, arsenic, antimony, and bismuth. Group VI A of the periodic table includes elements such as sulfur, selenium, and tellurium.

In an embodiment of the present invention, the phase change material may include one or more elements from Group I B of the periodic table, such as silver or gold. In another embodiment of the present invention, the phase change material may also include one or more elements from Group VIII B of the periodic table, such as cobalt or palladium.

Figure 2:
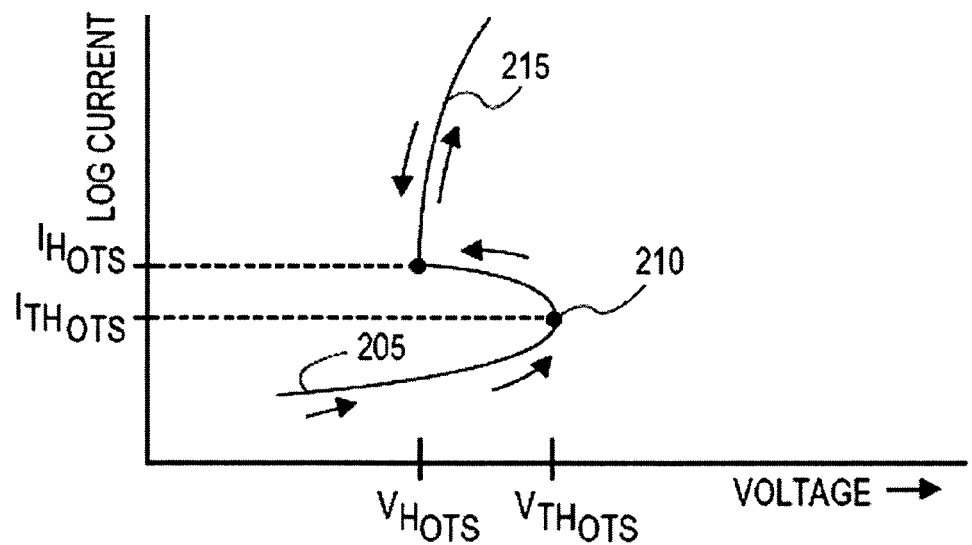
FIG. 2 shows a graph of log current vs. voltage for an ovonic threshold switch (OTS) according to an embodiment of the present invention.

FIG. 2 shows a graph of log current vs. voltage for a snapback selector or access element 10, such as an ovonic threshold switch (OTS). Starting with a high electrical resistance (RESET) state at a low electric field, the current in the access element 10 increases 205 with increasing voltage with a very small current until a threshold voltage $V_{TH\_OTS}$ is reached.

After a snapback 210, a highly conductive dynamic ON state 215 is maintained in the access element 10 as long as a current higher than a holding current $I_{H\_OTS}$ is flowing through the access element 10. This transient high-conductivity state is electronic in origin and does not involve any phase change in the access element 10.

When the threshold voltage $V_{TH\_OTS}$ of the access element 10 is exceeded, the access element 10 switches from the OFF state to the ON state and allows current to flow through the phase change material storage element 20 that is connected in series to the access element 10. In the ON state, the voltage potential across the access element 10 remains close to a holding voltage ($V_{H,OTS}$) as the current flowing through the access element 10 increases.

The access element 10 may remain in the ON state until the current through the access element 10 drops below a holding current ($I_{H\_OTS}$). Below this value, the access element 10 may return to a high-resistance, non-conductive OFF state until the $V_{TH\_OTS}$ or $I_{TH\_OTS}$ is exceeded again. Whenever directed, the access element 10 may repeatedly and reversibly switch between the OFF state and the ON state, but it does not crystallize.

The PCMS 50 has a single-level cell (SLC) if only 1 bit of data is stored in the PCMS 50. The data values corresponding to the 2 logical states in each PCMS 50 include '1' and '0'. Thus, the phase change material in the PCM storage element 20 may be written (programmed) from one distinct memory state, such as a RESET state, to another distinct memory state, such as a SET state.

Figure 3:
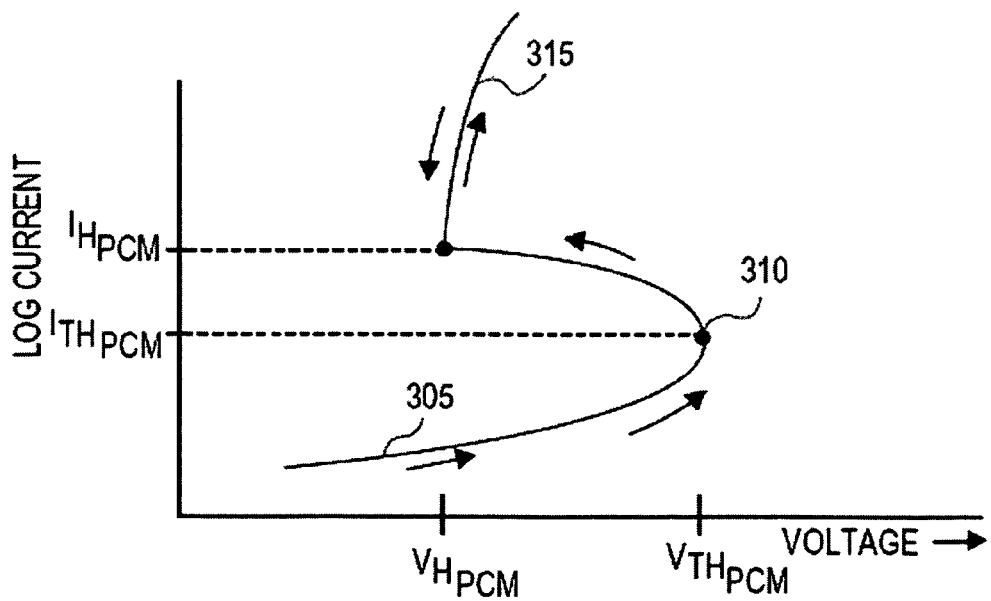
FIG. 3 shows a graph of log current vs. voltage for a phase change memory (PCM) in a RESET state according to an embodiment of the present invention.

FIG. 3 shows a graph of log current vs. voltage for a single PCM storage element 20 which does not have a snapback selector or access element 10 connected in series. Starting with a high electrical resistance (RESET) state at a low electric field, the current 305 in the PCM storage element 20 remains small, but increases non-linearly as the voltage increases until a threshold voltage $V_{TH,PCM}$ for the phase change material is reached.

After a voltage snapback 310, a highly conductive dynamic ON state 315 is maintained in the PCM storage element 20 as long as a current higher than a holding current $I_{H,PCM}$ is flowing through the PCM storage element 20.

In contrast to the PCM configuration described above, embodiments of the invention use a PCMS 50 configuration as shown in FIG. 1. The PCMS 50 configuration differs from the PCM configuration in that the PCMS 50 configuration includes a memory cell 5 which has a phase change memory (PCM) storage element 20 and a snapback selector or access element 10, otherwise referred to as the ovonic threshold switch (OTS).

Like the phase change material in the storage element 20 of the memory cell 5, the access element 10 also exhibits threshold switching. However, the access element 10 and the storage element 20 may include different types of materials with dissimilar threshold voltages $V_{TH}$ and threshold currents $I_{TH}$. Embodiments of the invention are associated with threshold switching and snapback behavior exhibited by the access element 10. Switching the access element 10 on and off can control access to the storage element 20 in the memory cell 5.

An easy glass former material is chosen for the access element 10 so that crystallization is extremely sluggish. In an absence of voltage and current, the access element 10 is amorphous at room temperature. The degree of crystallization of the access element 10 upon heating and application of a voltage and/or current is negligible. Unlike the phase change material in the storage element 20 of the memory cell 5, the access element 10 returns to an amorphous state after the voltage and current are turned off.

As shown in FIG. 1, an array of the memory cells 5 in the PCMS 50 may be organized into columns of bit lines 105 and rows of word lines 205. The bit line 105 and the word line 205 include conductors that are formed from a conductive material, such as copper. In different embodiments of the invention, a logical arrangement or a physical placement of the features in the PCMS 50 may vary in a layout. The memory cell 5 may optionally include a heater element 15 adjacent to and in thermal contact with the PCM storage element 20. The heater element 15 (when present) may have a topology of a lance or a micro-trench (not shown).

The heater element 15 further includes a conductor that is formed from a conductive material. The conductive material may include titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, or tantalum nitride (TaN), among others.

The access element 10 may be located towards the bit line 105 side of the storage element 20 (as shown in FIG. 1) or towards the word line 205 side of the storage element 20 (not shown). However, the access element 10 is not located between the heater 15 (when present) and the storage element 20.

After the access element 10 turns on, a current will flow through the heater element 15 (when present) that is connected in series. The heater element 15 (when present) is a resistive element that transfers heat, such as through Joule heating, to the storage element 20 during a SET or RESET write pulse or pulses. If the heater element 15 is not present, Joule heating occurs mostly in the storage element 20.

A particular combination of the bit line 105 and the word line 205 in the array may be addressed to access the memory cell 5. After selecting the memory cell 5 coupled to the bit line 105 and the word line 205, a voltage potential is applied to read or write the storage element 20 in the memory cell 5. During a read operation for the PCMS 50, a demarcation point voltage is applied to the memory cell 5 to interrogate a state of the phase change material in the storage element 20. If the memory cell 5 is in a SET state, then the memory cell 5 thresholds and current is sensed through a sensing circuit. However, if the memory cell 5 is in a RESET state, then there is no threshold and no current is sensed through the sensing circuit. Certain features of device architecture for the PCMS 50 have not been shown in FIG. 1 to avoid obscuring the present invention. Examples of some features that may not be shown include transistor circuits that serve as current sources, pulse generators, sense amplifiers, and voltage pre-chargers.

Figure 4:
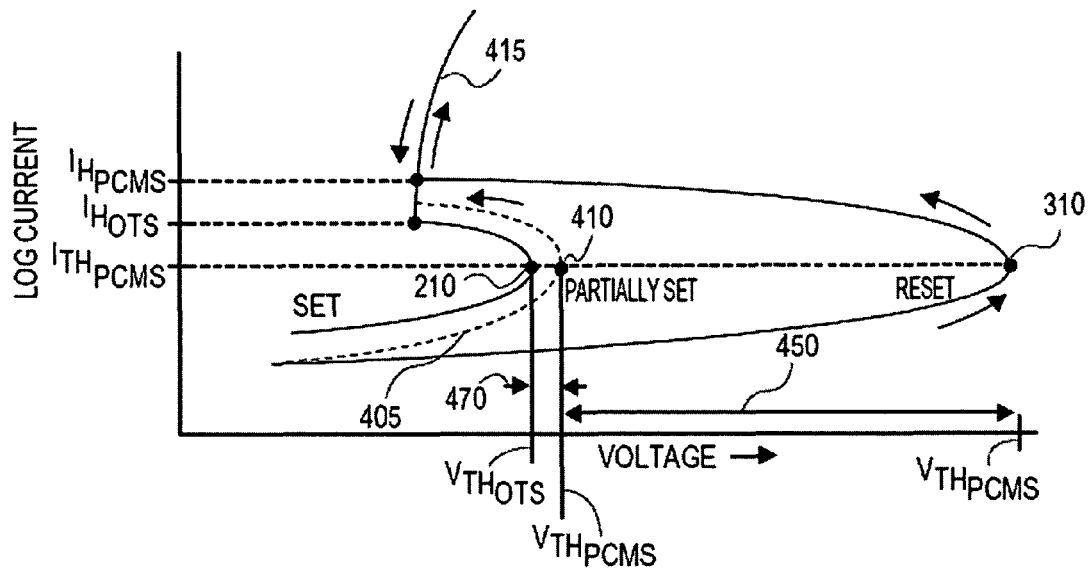
FIG. 4 shows a graph of log current vs. voltage for a PCMS according to an embodiment of the present invention.

Once the OTS 10 and the PCM storage element 20 are connected in series, a combined threshold voltage $V_{TH\ PCMS}$ of the PCMS 50 is established. If the PCM storage element 20 in the PCMS 50 is completely crystalline, $V_{TH\ PCM}$ is zero or substantially zero, so that $V_{TH\ OTS}$ of the access element must be equal to $V_{TH\ PCMS}$. As shown in FIG. 4, embodiments of the invention envision an energy-efficient write process to SET the phase change material in the storage element 20 of the PCMS 50. According to embodiments of the invention, one or more low-energy pulses may be used in the write (SET) process. Sufficient SET-to-RESET and RESET-to-SET statistics for a specific PCMS 50 technology are collected and used to determine an optimal profile for current (amplitude) vs. time (pulse width) for the write (SET) process in the present invention. This will accommodate variability in the PCM storage element 20, including the phase change material, in the memory cell 5 of the PCMS 50.

When the PCMS 50 configuration is used, the phase change material in the PCM storage element 20 does not need to be completely SET to $V_{TH\ PCM}=0$ as in conventional PCM-only memories. A completely crystalline phase change material has $V_{TH\ PCM}=0$, while an amorphous phase change material has $V_{TH\ PCM}=1$-4 V depending upon the composition of the phase change material and the geometry of the memory cell 5. A threshold voltage of $V_{TH\ PCM}=0$ in a completely crystalline phase change material would correspond to a voltage drop $V_{PCM}$ across the PCM storage element 20 (at a current level equal to $I_{TH\ OTS}$) of $V_{PCM}$ @ $I_{TH\ OTS}=0.001$ V (assuming $I_{TH\ OTS}=1$ µA and a SET resistance of 1 kOhm in the PCM storage element 20, as an illustrative example). In the PCMS configuration, however, the phase change material may be SET to a state in which $V_{PCM}$ @ $I_{TH\ OTS}<0.4$ V (wherein $V_{PCM}$ is voltage 470 in FIG. 4 and FIG. 5), for which the corresponding PCMS current-voltage curve is 405. The PCMS 50 may be configured to have a first circuit to write a SET state for the PCMS 50 and a second circuit to write a RESET state for the PCMS 50 wherein the first circuit is a lower current circuit than the second circuit. Alternately, the same circuit may be used to write the SET state and the RESET state for the PCMS 50.

Figure 7:
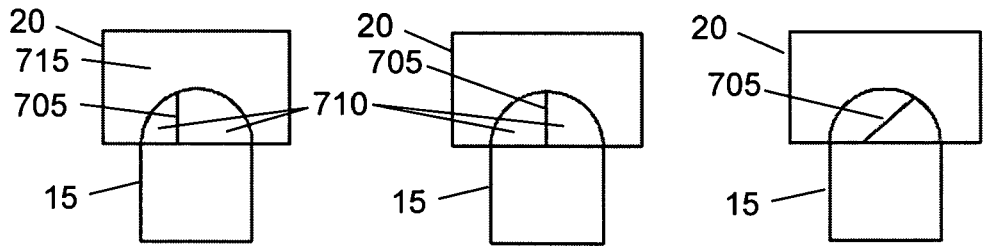
FIG. 7 shows a phase change memory storage element with an amorphous volume having conducting filament(s) according to embodiments of the present invention.
Figure 7:
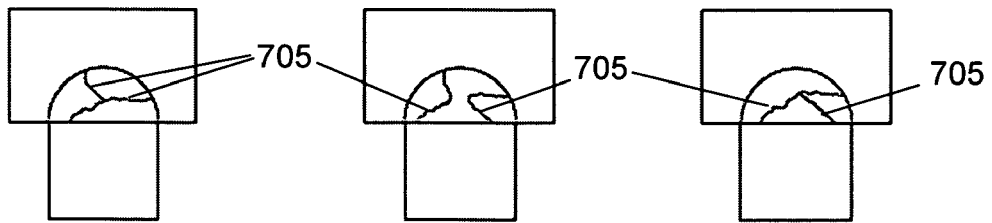
Figure 7:
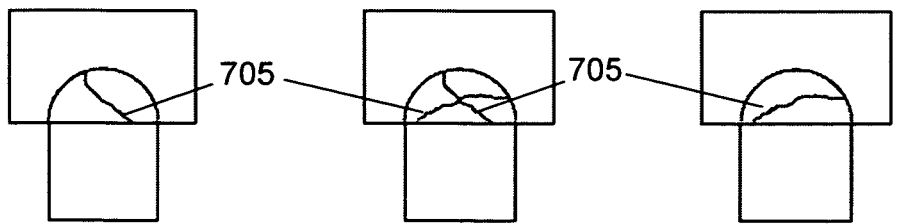

As shown in FIG. 7, creating a conducting filament 705, which may be a crystallized filament in an amorphous volume 710 of the PCM storage element 20 comprising a crystalline volume 715, the amorphous volume 710, and the conducting filament 705 allows a SET pulse or pulses of much lower energy than for a conventional SET pulse that crystallizes the phase change material of the PCM storage element 20 completely to $V_{TH\ PCM}=0$. Further according to embodiments of the invention, an amplitude of a SET pulse current is 10-15% or less than an amplitude of a RESET pulse current. In another embodiment, the amplitude of the SET pulse current is approximately 1% of the RESET pulse.

In embodiments of the invention as shown in FIG. 7, the conducting filament 705 extends from the heater element 15 through the amorphous volume 710 to the crystalline volume 715 of the PCM storage element 20. Although $V_{PCM}$ @ $I_{TH\ OTS}$ drops significantly to 0.4 V, an electrical resistance of the phase change material may not drop as much from its original RESET resistance value and may therefore still be quite high, such as 10-100 times the minimum SET resistance for a completely crystalline cell. A low-energy SET pulse or pulses may not be able to obtain sufficient resistance contrast in PCM-only memories, in which the resistance is measured to determine the state of the cell.

$V_{PCM}$@$I_{TH\ OTS}$ drops to 0.4 V or less easily due to the conducting filament 705, but the resistance does not drop as quickly. The 0.4 V is used as an illustrative example for a voltage drop 470 that is low compared to $V_{TH\ PCM}=1$-4 V in the RESET state of the phase change material. Other values of the voltage drop 470 may be selected from a range of 0.1-0.5 V.

Figure 5:
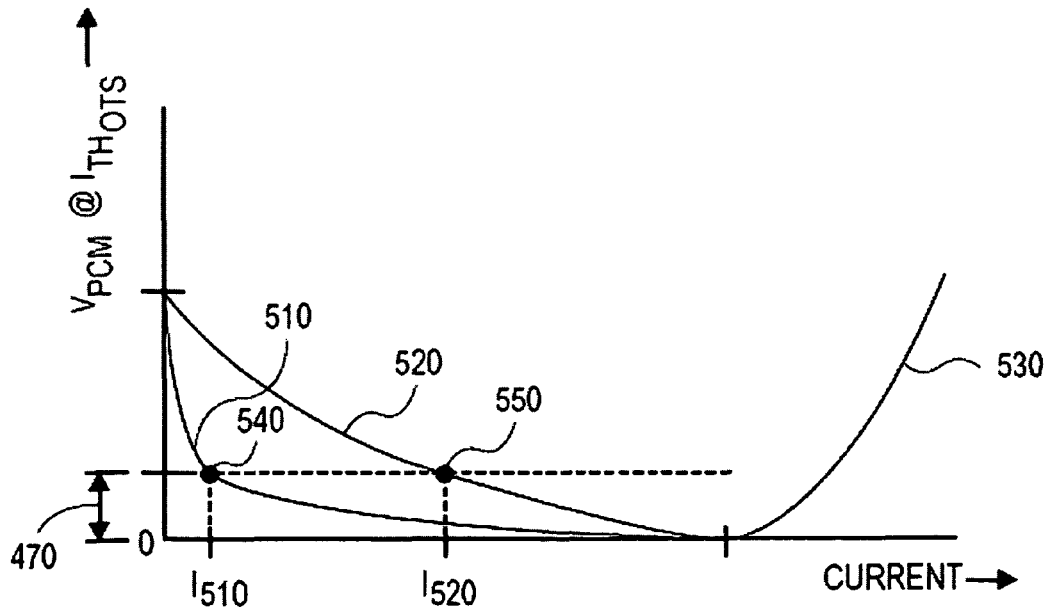
FIG. 5 shows a graph of log voltage vs. current for a PCM according to an embodiment of the present invention.

FIG. 5 shows a graph of log voltage vs. current for two different phase change materials: a first phase change material 510 and a second phase change material 520, without a switch such as an OTS. In both cases, the phase change material has been preconditioned to an (amorphous) RESET state before a current amplitude (horizontal axis) is applied. The vertical axis shows the voltage drop $V_{PCM}$ across the PCM storage element 20 at a fixed given current $I_{TH\ OTS}$, which may represent the threshold current of OTS (though OTS is not present in this example), and which may be 1 µA for example. The phase change material 510 has a steeper SET curve and may be a more suitable candidate material for the storage element 20 than the phase change material 520 because a lower current is required to program the material to a state in which $V_{PCM}$ @$I_{TH\ OTS}<0.4V$ (voltage drop 470) in a PCMS cell that does include OTS. The two phase change materials may share a similar RESET curve 530.

In the read process, a demarcation voltage needs to be slightly higher, such as by a voltage drop 470, than $V_{TH\ OTS}$. Once the access element 10 snapback occurs in a read process, the voltage is transferred from the access element 10 to the PCM storage element 20 due to a parasitic resistance capacitance product RC that is associated with connectivity of the two terminals of the memory cell 5.

In a demarcation read process, if the transferred voltage minus a voltage drop 470, such as 0.4 V, at the phase change material (which does not need to be provided any further by the transfer) is larger than the threshold voltage $V_{TH\ PCM}$ of the PCM storage element 20, then the PCM storage element 20 in the memory cell 5 will also undergo a triggered electronic threshold switching and snap back 410 just as the access element 10 had already snapped back earlier. Thus, the access element 10 serves as an amplifier and the voltage drop of the access element 10 drops on the PCM.

With this demarcation read mechanism, if the PCM storage element 20 in the memory cell 5 has a threshold voltage less than a sum of the snapback voltage 210 and a voltage drop 470, when the demarcation voltage is greater than a sum of the OTS 10 threshold voltage and a voltage drop 470, of the storage element 20 with the current equal to OTS 10 threshold current, then the phase change material in the memory cell 5 will snap back.

In the above example, for a single memory cell, a demarcation read voltage within the voltage range 450 may be used (FIG. 4). In an embodiment of the present invention, the voltage range 450 is 2-4 V wide.

Figure 6:
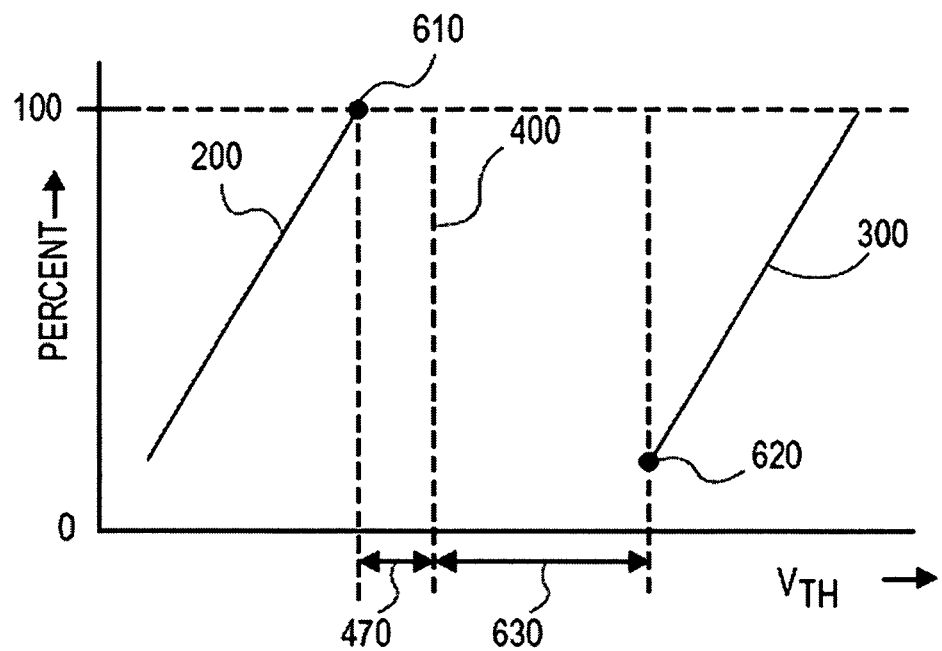
FIG. 6 shows a cumulative probability plot of threshold voltage for an array of memory cells according to an embodiment of the present invention.

FIG. 6 shows a cumulative probability plot vs. threshold voltage for an array of PCMS 50 memory cells 5. The line denoted as 200 represents the distribution of threshold voltages in the SET state of the PCMS 50 (completely crystalline, therefore being equal to the threshold voltage of OTS), and the line denoted as 300 represents the distribution of threshold voltages in the RESET state of the PCMS 50. In an array of memory cells 5, the read demarcation voltage must be located within the voltage range 630 and must therefore be higher by a voltage drop 470, such as 0.4 V, than the PCMS 50 memory cell 5 with the highest OTS threshold voltage 610. Also, the read demarcation voltage must be lower than the PCMS 50 memory cell 5 with the lowest RESET threshold voltage 620.

Therefore, in contrast to a conventional resistance read scheme for phase change memory which requires a complete crystallization of the phase change material, the SET resistance requirement for the voltage demarcation point read can be relaxed. The memory cell 5 need not be programmed to a low resistance state as would otherwise have been required for a conventional scheme to read resistance. The resistance of the states 540 and 550, as shown in FIG. 5, may still be quite high, such as 10-100 times the minimum SET resistance for a completely crystalline phase change material.

As a result, the relaxed SET requirement allows use of a lower SET energy through use of a low-energy SET pulse or pulses for the SET write operation since the phase change material does not need to be completely crystallized, using a SET method combined with the PCMS 50 configuration (i.e., when an access element 10 that exhibits threshold switching, such as an OTS is present) without reduction of read window size or signal-to-noise ratio. In the conventional read scheme for PCM-only memories, this SET method would increase the SET resistance, such as by a factor of 10-100, compared to the completely crystalline SET state, and therefore significantly reduce read window size and signal to noise ratio. Thus the SET to RESET energy ratio need not be as high as 100:1 or even 10:1 and may approach 1:1. For example, the SET current may be 10 to 20× lower than in a PCM-only memory for which the access element 10 is not used.

Using such a read mechanism, the SET current amplitude can be as low as 1% of the RESET current and would not need to be higher than at most 10-15% of the RESET current. As an example, if the RESET current is around 1.5 mA, the memory cell 5 may be SET with about 15 uA current since SET only creates a conductive filament in the amorphous volume of the storage element 20, wherein the conductive filament may be a crystalline filament or a partially crystalline filament.

The RESET current depends on the architecture and the size of the memory cell 5. For example, the RESET current could be considerably lower than 1.5 mA, such as 0.2 mA, for a much smaller cell or a different architecture (not shown). However, the SET amplitude would then decrease proportionately so that 0.5%-20% of the RESET current would still be sufficient to crystallize the conductive filament in the amorphous volume of the storage element 20.

A duration of current flow depends on (a) thermal conductivity of the access element 10, the phase change material (in the storage element 20), the heater 15 (if present), and the surrounding materials, (b) the shape and size of the amorphous volume (in the bit), and (c) the device architecture (logical and physical layout) of the PCMS 50.

In an embodiment of the present invention, a SET pulse width (duration of current flow) is about 250-500 nsec. In another embodiment of the present invention, a SET pulse width is about 125-250 nsec. In a further embodiment of the present invention, the SET pulse width is about 45-125 nsec. In yet another embodiment of the present invention, the SET pulse width is about 10-45 nsec. In some phase change materials, a necessary pulse width may be as high as 500 ns, but the pulse amplitude is very low so a desired low energy or power may still be achieved.

Characteristics similar to the access element 10 may apply to a thyristor based selector such as SCR or DIAC. In an embodiment of the present invention, the access element 10 includes a thyristor (not shown). The thyristor has an anode, a cathode, and a gate. The two transistors in the thyristor feed each other (through their respective base currents), so the thyristor operates as a complementary regenerative switch.

After being turned on, the thyristor remains conducting even if a voltage applied (through the word line) to the gate is removed. Thus, the thyristor can be triggered, or activated, by a short pulse to the gate, but the voltage signal from the word line need not remain high during an entire access time. The thyristors for the non-selected bit lines do not conduct since they are effectively shorted out. Furthermore, any leakage through the non-selected bit lines is greatly reduced.

As appropriate, the thyristor may be turned off, or deactivated, by reducing voltage below a predetermined minimum holding voltage, such as by shorting out the anode and the cathode, such as by bringing the bit line (coupled to the anode) down to the voltage of the source line (coupled to the cathode), which may be ground in one embodiment of the present invention.

If an anode-to-cathode voltage, such as a bit line-to-source line voltage, is kept low, such as below 2 volts, the thyristor acts as an open circuit and isolates the storage element electrically. However, if the bit line voltage is raised, such as substantially more than 2 volts, above the source line voltage, the thyristor breaks down, the voltage snaps back, the thyristor becomes activated, and the thyristor conducts. When the thyristor is conducting, the associated storage element becomes electrically coupled to the bit line and is available for access, such as for a program (write) or read operation.

In another embodiment of the invention, the access element 10 includes a semiconductor-controlled rectifier (SCR) with a 4-layer configuration, such as a vertically-oriented pnpn structure formed on a substrate (not shown).

In still another embodiment of the present invention, the access element 10 includes a pair of SCRs sharing a laterally-oriented pnpn structure formed in a substrate (not shown).

An amorphous volume in the phase change material in the RESET state is shown as an amorphous hemisphere or dome in FIG. 7. Alternatively, other topologies may be used for the amorphous volume in the storage element 20. For example, depending on the device architecture of the PCMS 50, the amorphous volume may include an amorphous line (not shown) or an amorphous bridge (not shown). Further, in another embodiment the heater element 15 may not be present. Also, other embodiments may even use a complete amorphization of the PCM storage element 20 in a RESET process, leaving substantially no crystalline volume remaining.

In an embodiment of the invention as shown in FIG. 7, the energy-efficient write pulse or pulses form conductive filaments 705 within the amorphous volume 710, such as amorphous dome, of the PCMS 50. The conductive filament 705 may be crystalline. It may or may not be formed by merging together a series of adjacent small localized crystal nucleation centers inside the amorphous dome. The PCM storage element 20 may be located directly adjacent to and in electrical contact with other electrode materials (not shown).

A SET current of 15 μA or more may be higher than the threshold current of the PCM storage element 20 or the access element 10, which is typically between 0.1 μA and 10 μA in both cases. Therefore, both the PCM storage element 20 and the access element 10 are in the on-state during the SET pulse (WRITE). If the PCM storage element 20 is in the on-state, a highly-conducting filament may already exist which would then remain conductive (or become crystalline) when the SET pulse is switched off.

As shown in FIG. 7, although the amorphous volume 710 or dome may remain almost the same size, the conductive filament eventually extends completely through the amorphous volume 710 or dome and allows a current to flow. Forming conductive filaments reduces threshold voltage of the phase change material but may not necessarily reduce resistance to a level required for conventional resistance-based read schemes used for the phase change material. In order to reduce $V_{PCM}@I_{TH\_OTS}$ down to 0.4 V in the PCM storage element 20, a conducting filament 705, such as a crystalline filament or partially crystallized region must extend from the heater 15 (when present) completely through the amorphous dome 710, outside of which the phase change material is always crystalline.

Figure 8:
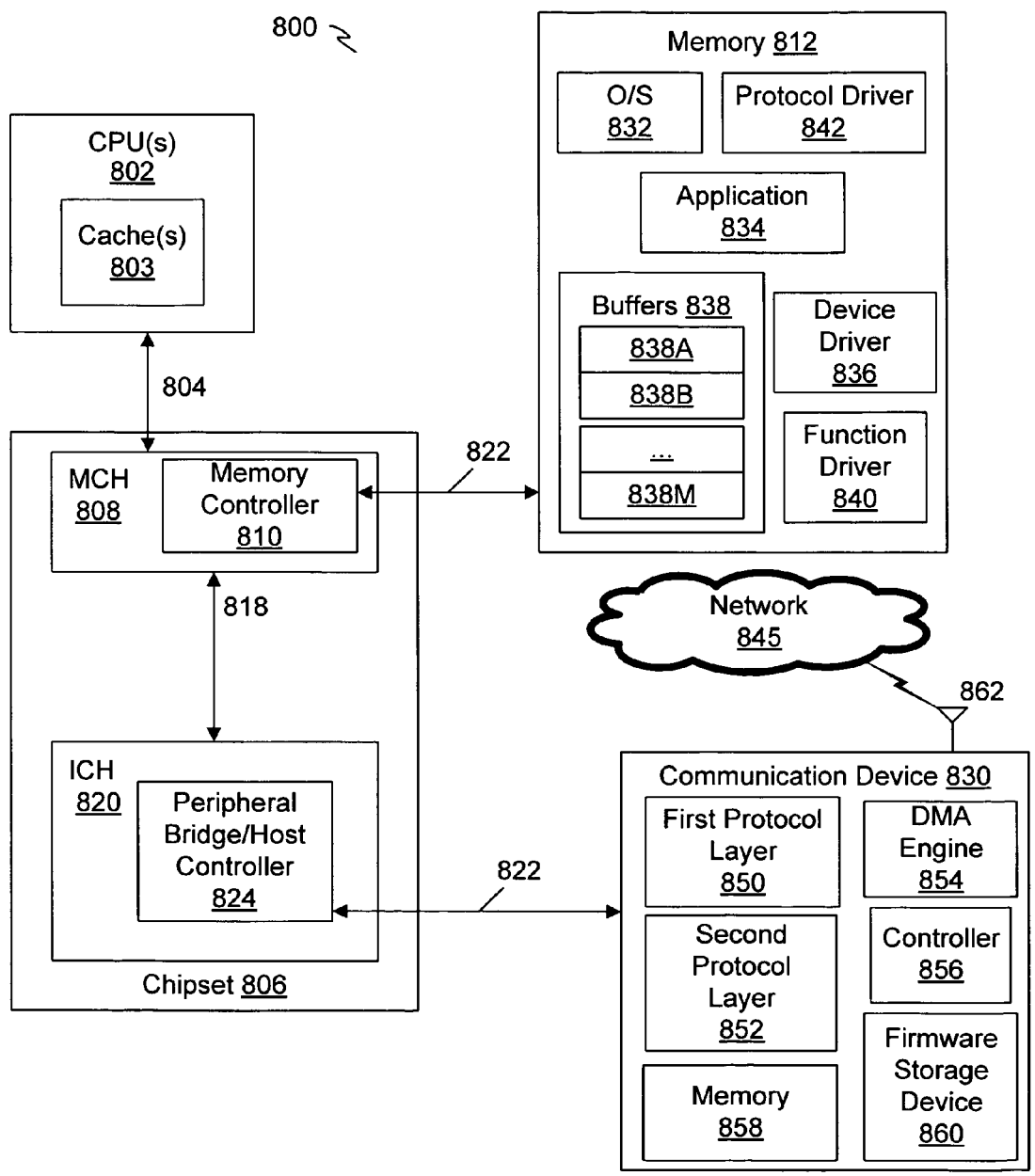
FIG. 8 shows a block diagram of an electronic device comprising various embodiments of the invention.

FIG. 8 illustrates a block diagram of an electronic device comprising various embodiments of the invention. The electronic device 800 may include one or more host processors or central processing unit(s) (CPUs) 802 (which may be collectively referred to herein as "processors 802" or more generally "processor 802") coupled to an interconnection network or bus 804. The processors 802 may be any type of processor such as a general purpose processor, a network processor (which may process data communicated over a computer network), etc. (including a reduced instruction set computer (RISC) processor or a complex instruction set computer (CISC)). Moreover, the processors 802 may have a single or multiple core design. The processors 802 with a multiple core design may integrate different types of processor cores on the same integrated circuit (IC) die. Also, the processors 802 with a multiple core design may be implemented as symmetrical or asymmetrical multiprocessors.

The processor 802 may include one or more caches 803, which may be private and/or shared in various embodiments. Generally, a cache 803 stores data corresponding to original data stored elsewhere or computed earlier. To reduce memory access latency, once data is stored in a cache 803, future use may be made by accessing a cached copy rather than refetching or recomputing the original data. In various embodiments, the cache 803 comprises the PCMS 50 of FIG. 1.

A chipset 806 may additionally be coupled to the interconnection network 804. The chipset 806 may include a memory control hub (MCH) 808. Alternately, the processor 802 and the MCH 808 may be combined to form a single chip. The MCH 808 may include a memory controller 810 that is coupled to a memory 812. The memory 812 may store data, e.g., including sequences of instructions that are executed by the processor 802, or any other device in communication with components of the electronic device 800. In various embodiments, the memory 812 includes one or more volatile storage or non-volatile memory devices such as the PCMS 50 of FIG. 1.

The memory 812 may include one or more of the following in various embodiments: an operating system (O/S) 832, application 834, device driver 836, buffers 838, function driver 840, and/or protocol driver 842. The processor(s) 802 executes various commands and processes one or more packets with one or more computing devices coupled to the network 845 over a radio 862.

In various embodiments, the application 834 may utilize the O/S 832 to communicate with various components of the electronic system 800, e.g., through the device driver 836 and/or function driver 840.

As illustrated in FIG. 8, the communication device 830 includes a first network protocol layer 850 and a second network protocol layer 852 for implementing the physical (PHY) layer to send and receive network packets to and from a base station, an access point, and/or other stations (not shown) over the radio 862. The communication device 830 may further include a direct memory access (DMA) engine 854, which may write packet data to buffers 838 to transmit and/or receive data. Additionally, the electronic device 800 may include a controller 856, which may include logic, such as a programmable processor for example, to perform communication device related operations. In various embodiments, the controller 856 may be a MAC (media access control) component. The communication device 830 may further include a memory 858 of any type of volatile/nonvolatile memory devices comprising the PCMS 50 of FIG. 1.

In various embodiments, the communication device 830 may include a firmware storage device 860 to store firmware (or software) that may be utilized in management of various functions performed by components of the communication device 830. The storage device 860 may be any type of a storage device such as a non-volatile storage device comprising the PCMS 50 of FIG. 1.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

We claim:

1. A method comprising:
   using a low-energy SET pulse to threshold an access device and write a phase change material in a PCM storage element of a phase change memory with switch (PCMS), wherein the low-energy SET pulse comprises a SET current that is significantly lower than that used for a phase change memory based on a resistive read scheme, wherein the PCM storage element comprises an amorphous volume after writing the phase change material, and wherein the low-energy SET pulse reduces a threshold voltage of the phase change material to enable a snap-back of a PCMS cell; and
   using a demarcation voltage to read the PCMS, wherein the low-energy SET pulse does not reduce an electrical resistance of the phase change material to a level involved with the resistive read scheme;
wherein an electrical resistance of a SET state is 10-100 times higher than an electrical resistance of a SET state in a phase change memory based on the resistive read scheme.

2. The method of claim 1 wherein an OTS and the storage element are connected in series.

3. The method of claim 1 wherein the access device is an OTS that does not change phase.

4. The method of claim 1 wherein an amplitude of a SET pulse current is 15% or less of an amplitude of a RESET pulse current.

5. The method of claim 4 wherein the SET pulse current forms a conducting filament in the amorphous volume of the phase change material.

6. The method of claim 1 further comprising using a plurality of SET pulses to write the phase change material in the PCM storage element.

7. A phase change memory with switch (PCMS) comprising:
a memory cell, the memory cell comprising an access device and a phase change memory (PCM) storage element, the PCM storage element comprising an amorphous volume, a crystalline volume, and a conducting filament in the amorphous volume, wherein the conducting filament extends through the amorphous volume and connects to the crystalline volume; and
a source to apply a read demarcation voltage or current to the storage element, wherein an electrical resistance of the PCM storage element in a SET state is about 10 to about 100 times higher than an electrical resistance of a SET state in a phase change memory based on a resistive read scheme.

8. The phase change memory with switch of claim 7, wherein the read demarcation voltage is sufficient to threshold the access device.

9. The phase change memory with switch of claim 7, further comprising a heater element, wherein the conducting filament connects the heater element to the crystalline volume.

10. The phase change memory with switch of claim 7, wherein the electrical resistance of the PCM storage element in the SET state is higher than a PCM storage element that is substantially crystalline.

11. The phase change memory with switch of claim 7, further comprising a first circuit to write the SET state for the PCMS and a second circuit to write a RESET state for the PCMS.

12. The phase change memory with switch of claim 11, wherein the first circuit is a lower current circuit than the second circuit.

13. A system comprising:
a processor; and
a phase change memory with switch (PCMS), wherein the PCMS comprises:
an access device; and
a phase change memory (PCM) storage element connected in series to the access device, wherein the PCM storage element comprises an amorphous volume, a crystalline volume, and a conducting filament in the amorphous volume, wherein the conducting filament extends through the amorphous volume and connects to the crystalline volume, and wherein an electrical resistance of the PCM storage element in a SET state is about 10 to about 100 times higher than an electrical resistance of a SET state in a phase change memory based on a resistive read scheme.

14. The system of claim 13, wherein a read voltage is sufficient to threshold the OTS.

15. The system of claim 13, further comprising a heater element, wherein the conducting filament connects the heater element to the crystalline volume.

16. The system of claim 13, wherein the electrical resistance of the PCM storage element in the SET state is higher than a PCM storage element that is substantially crystalline.

17. The system of claim 13, further comprising a first circuit to write the SET state for the PCMS and a second circuit to write a RESET state for the PCMS.

* * * * *